United States Patent
Jeon et al.

(10) Patent No.: US 8,907,377 B2
(45) Date of Patent: Dec. 9, 2014

(54) HIGH ELECTRON MOBILITY TRANSISTOR AND METHOD OF MANUFACTURING THE SAME

(71) Applicant: Samsung Electronics Co., Ltd., Suwon-Si, Gyeonggi-Do (KR)

(72) Inventors: Woo-chul Jeon, Daegu (KR); Ki-yeol Park, Suwon-si (KR); Young-hwan Park, Seoul (KR); Jai-kwang Shin, Anyang-si (KR); Jae-joon Oh, Seongnam-si (KR); Hyuk-soon Choi, Hwaseong-si (KR); Jong-bong Ha, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/752,821

(22) Filed: Jan. 29, 2013

(65) Prior Publication Data
US 2014/0021510 A1    Jan. 23, 2014

(30) Foreign Application Priority Data
Jul. 17, 2012    (KR) .................. 10-2012-0077923

(51) Int. Cl.
*H01L 29/66* (2006.01)
*H01L 29/778* (2006.01)
*H01L 29/417* (2006.01)
*H01L 29/40* (2006.01)
*H01L 29/20* (2006.01)

(52) U.S. Cl.
CPC .......... *H01L 29/778* (2013.01); *H01L 29/7786* (2013.01); *H01L 29/66431* (2013.01); *H01L 29/41766* (2013.01); *H01L 29/402* (2013.01); *H01L 29/66462* (2013.01); *H01L 29/407* (2013.01); *H01L 29/2003* (2013.01); *H01L 29/41758* (2013.01)
USPC .................. 257/194; 257/195; 257/E29.245; 257/E29.246; 257/E29.252

(58) Field of Classification Search
CPC ............ H01L 29/2003; H01L 29/7787; H01L 29/66462; H01L 29/7783; H01L 29/42316; H01L 27/0605; H01L 21/8252
USPC .................. 257/194, 195, E29.245–E29.248, 257/E29.252
See application file for complete search history.

(56) References Cited

U.S. PATENT DOCUMENTS

| | | |
|---|---|---|
| 2005/0001235 A1 | 1/2005 | Murata et al. |
| 2005/0189562 A1* | 9/2005 | Kinzer et al. .................. 257/192 |
| 2006/0289894 A1 | 12/2006 | Murata et al. |
| 2010/0224911 A1 | 9/2010 | Okita et al. |
| 2010/0255646 A1 | 10/2010 | Suh et al. |
| 2011/0037100 A1 | 2/2011 | Hikita et al. |
| 2011/0260216 A1* | 10/2011 | Hebert .......................... 257/194 |
| 2011/0284928 A1* | 11/2011 | Shibata et al. ................ 257/195 |

FOREIGN PATENT DOCUMENTS

| | | |
|---|---|---|
| JP | 2011108712 A | 6/2011 |
| JP | 2011109131 A | 6/2011 |
| KR | 1020050109636 A | 11/2005 |
| KR | 1020110098579 A | 9/2011 |

* cited by examiner

*Primary Examiner* — Cuong Q Nguyen
*Assistant Examiner* — Nishath Yasmeen
(74) *Attorney, Agent, or Firm* — Harness, Dickey & Pierce, P.L.C.

(57) ABSTRACT

A higher electron mobility transistor (HEMT) and a method of manufacturing the same are disclosed. According to example embodiments, the HEMT may include a channel supply layer on a channel layer, a source electrode and a drain electrode that are on at least one of the channel layer and the channel supply layer, a gate electrode between the source electrode and the drain electrode, and a source pad and a drain pad. The source pad and a drain pad electrically contact the source electrode and the drain electrode, respectively. At least a portion of at least one of the source pad and the drain pad extends into a corresponding one of the source electrode and drain electrode that the at least one of the source pad and the drain pad is in electrical contact therewith.

32 Claims, 12 Drawing Sheets

HIGH ELECTRON MOBILITY TRANSISTOR AND METHOD OF MANUFACTURING THE SAME

CROSS-REFERENCE TO RELATED APPLICATIONS

This application claims priority under 35 U.S.C. §119 to Korean Patent Application No. 10-2012-0077923, filed on Jul. 17, 2012, in the Korean Intellectual Property Office, the disclosure of which is incorporated herein in its entirety by reference.

BACKGROUND

1. Field

Example embodiments relate to power devices, and more particularly, to high electron mobility transistors and methods of manufacturing the same.

2. Description of the Related Art

In a power conversion system, an efficiency of the entire system may depend on an efficiency of a power switching device. As a switching device, a power metal oxide semiconductor field effect transistor (MOSFET) or an insulated gate bipolar transistor (IGBT) using silicon has been mainly used. However, increasing the efficiency of some switching devices may be limited due to material limitations of silicon.

To overcome the limitations of silicon material, research into a high electron mobility transistor (HEMT) is being actively conducted.

An HEMT may include semiconductor layers having different electrical polarization characteristics. A semiconductor layer having a relatively large polarizability in the HEMT may cause a two-dimensional electron gas (2DEG) in other semiconductor layers that are hetero-bonded with the semiconductor layer. The 2DEG may be used as a channel between a drain electrode and a source electrode, and an electric current flowing in the channel may vary according to a voltage applied to the drain and source electrodes.

To apply a voltage to the drain and source electrodes, the HEMT may include a drain pad and a source pad that electrically contact the drain electrode and the source electrode, respectively. To uniformly apply a voltage to the entire region of the drain electrode and the source electrode via the drain pad and the source pad, the areas of the drain and source pads may need to have at least a desired (and/or alternatively predetermined) area. In this regard, the areas of the drain pad and the source pad are determined by the widths and thicknesses of the pads.

For the areas of the drain and source pads to have at least a desired (and/or alternatively predetermined) area, there is a method of increasing the widths of the drain pad and the source pad. When the widths of the drain and source pads are increased, however, a length of a channel formed between the drain pad and the source pad becomes relatively small, or the entire size of the HEMT increases.

SUMMARY

Example embodiments relate to high electron mobility transistors (HEMTs) having wide pad areas without reducing the lengths of channels or increasing the sizes of the HEMTs and HEMTs that are manufactured using a simple manufacturing process, in which the deterioration of adhesive strengths between pads and electrodes is reduced (and/or prevented).

Example embodiments relate to methods of manufacturing HEMTs.

Additional aspects will be set forth in part in the description which follows and, in part, will be apparent from the description, or may be learned by practice of example embodiments.

According to example embodiments, a high electron mobility transistor includes a channel layer; a channel supply layer on the channel layer; a source electrode and a drain electrode that are on at least one of the channel layer and the channel supply layer; a gate electrode between the source electrode and the drain electrode; and a source pad and a drain pad that electrically contact the source electrode and the drain electrode, respectively. At least a portion of at least one of the source pad and the drain pad extends into a corresponding one of the source electrode and the drain electrode that the at least one of the source pad and the drain pad is in electrical contact therewith.

In example embodiments, the source pad may include a contact portion that electrically contacts the source electrode, and the source pad may include an insertion portion that extends into the source electrode.

In example embodiments, the insertion portion may penetrate the source electrode.

In example embodiments, the high electron mobility transistor may further include a substrate, and the channel layer may be on the substrate In example embodiments, the insertion portion of the source electrode may extend to at least one of the channel supply layer, the channel layer, and the substrate.

In example embodiments, an insulating layer may be between the insertion portion of the source pad and at least one of the channel layer and the source electrode.

In example embodiments, the source pad may include a plurality of the insertion portions, and the plurality of insertion portions of the source pad may be spaced apart from each other along a longitudinal direction of the source pad.

In example embodiments, the source pad may include a first region having the plurality of insertion portions and a second region that does not have the plurality of insertion portions. The first region and the second region may be alternately arranged along the longitudinal direction of the source pad.

The second region of the source pad may include a bonding area that is bonding-connected to a lead wire.

In example embodiments, the drain pad may include a contact portion that electrically contacts the drain electrode, and the drain pad may include an insertion portion that extends into the drain electrode.

In example embodiments, the insertion portion of the drain pad may penetrate the drain electrode.

In example embodiments, the high electron mobility transistor may further include a substrate, and channel layer may be on the substrate.

In example embodiments, the insertion portion of the drain pad may extend to at least one of the channel supply layer, the channel layer, and the substrate.

In example embodiments, an insulating layer may be between the insertion portion of the drain pad and at least one of the channel layer and the drain electrode.

In example embodiments, the drain pad may include a plurality of the insertion portions, and the plurality insertion portions of the drain pad may be spaced apart from each other along a longitudinal direction of the drain pad.

In example embodiments, the drain pad may include a first region having the plurality of insertion portions and a second region that does not have the plurality of insertion portions, and the first region and the second region may be alternately arranged along the longitudinal direction of the drain pad.

In example embodiments, an area of the first region of the drain pad may be smaller than an area of the second region of the drain pad.

In example embodiments, the second region of the drain pad may include a bonding area that is bonding-connected to a lead wire.

In example embodiments, the source electrode may include a plurality of source fingers that extend toward the drain electrode, the drain electrode may include a plurality of drain fingers that extend between the plurality of source fingers, and the portion of at least one of the source pad and the drain pad may extend into a corresponding one of the plurality of source fingers and the plurality of drain fingers included in the source electrode and the drain electrode, respectively, that the at least one of the source pad and the drain pad is in electrical contact therewith.

In example embodiments, the source pad may include a contact portion that electrically contacts at least one of the plurality of source fingers, and an insertion portion that extends into at least one of the plurality of source fingers.

In example embodiments, the drain pad may include a contact portion that electrically contacts at least one of the plurality of drain fingers and an insertion portion that extends into at least one of the plurality of drain fingers.

According to example embodiments, a method of manufacturing a high electron mobility transistor includes forming a channel supply layer on a channel layer; forming a source electrode and a drain electrode on at least one of the channel layer and the channel supply layer; forming a gate electrode between the source electrode and the drain electrode; forming pad accommodation portions that are recessed from top surfaces of the source electrode and the drain electrode; and forming a source pad and a drain pad that electrically contact the source electrode and the drain electrode, respectively, and at least partially extend into the pad accommodation portions.

In example embodiments, the method may further include forming an insulating layer in each pad accommodation portions, before the forming of the source pad and the drain pad.

According to example embodiments, a high electron mobility transistor includes a channel layer; a channel supply layer on the channel layer; a source electrode and a drain electrode that are on at least one of the channel layer and the channel supply layer; a gate electrode between the source electrode and the drain electrode; a source pad; and a drain pad. The source electrode includes a plurality of source fingers that extend toward the drain electrode. The drain electrode includes a plurality of drain fingers that extend between the plurality of source fingers. The source pad electrically contacts at least one of the plurality of source fingers. The drain pad electrically contacts at least one of the plurality of drain fingers. At least a portion of at least one of the source pad and the drain pad extends into a corresponding one of the plurality of source fingers and the plurality of drain fingers that the at least one of the source pad and the drain pad is in electrical contact therewith.

The source pad may include a contact portion that electrically contacts at least one of the plurality of source fingers and an insertion portion that extends into at least one of the plurality of source fingers.

The drain pad may include a contact portion that electrically contacts at least one of the plurality of drain fingers, and an insertion portion that extends into at least one of the plurality of drain fingers.

According to example embodiments, a high electron mobility transistor includes a channel layer; a channel supply layer on the channel layer; a first electrode, a gate electrode, and a second electrode that are spaced apart and independently on at least one of the channel layer and the channel supply layer. The high electron mobility transistor includes at least one of a first pad having a contact portion that is electrically connected to the first electrode and an insertion portion that extends into the first electrode, and a second pad having a contact portion that is electrically connected to the second electrode and an insertion portion that extends into the second electrode.

In example embodiments, an insulation layer may be between at least one of the insertion portion of the first pad and the first electrode, and the insertion portion of the second pad and the second electrode.

In example embodiments, the contact portion of at least one of the first pad and the second pad may be on an upper surface of a corresponding one of the first electrode and the second electrode, and the insertion portion of at least one of the first pad and the second pad may extend from the contact portion of the at least one of the first pad and the second pad to at least one of the channel supply layer and the channel layer.

In example embodiments, both the first pad and the second pad may be included in the high electron mobility transistor, the first electrode may include a plurality of first fingers that are spaced apart and extend toward the second electrode, the second electrode may include a plurality of second fingers that extend between the plurality of first fingers of the first electrode, the contact portion of the first pad may be electrically connected to at least one of the plurality of second fingers, the insertion portion of the first pad may extend into at least one of the plurality of first fingers, and the insertion portion of the second pad may extend into at least one of the plurality of second fingers.

In example embodiments, at least one of the first pad and the second pad includes a plurality of the insertion portions that are spaced apart along a longitudinal direction of the one of the first pad and the second pad.

In example embodiments, a voltage may be uniformly applied to the drain and source electrodes by achieving wide pad areas. An active area in which a channel is formed may be increased in the HEMT by decreasing the widths of pads. In addition, the pads may be formed low in height and thus, manufacturing processes may be simplified and a decrease in adhesive strengths between the pads and electrodes that contact the pads may be limited and/or prevented.

BRIEF DESCRIPTION OF THE DRAWINGS

These and/or other aspects will become apparent and more readily appreciated from the following description of non-limiting embodiments, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION

Figure 1:
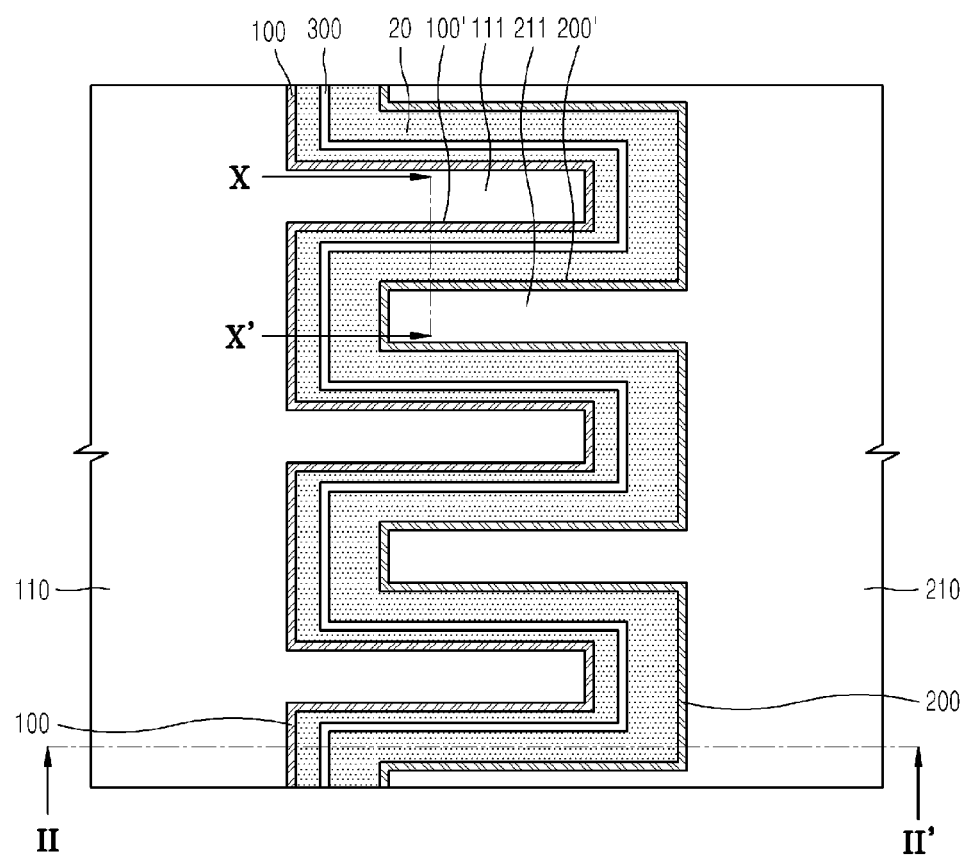
FIG. 1 is a plan view of a high electron mobility transistor (HEMT) according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a high electron mobility transistor (HEMT) according to example embodiments and a method of manufacturing the HEMT according to example embodiments will be described with reference to the accompanying drawings.

Figure 2:
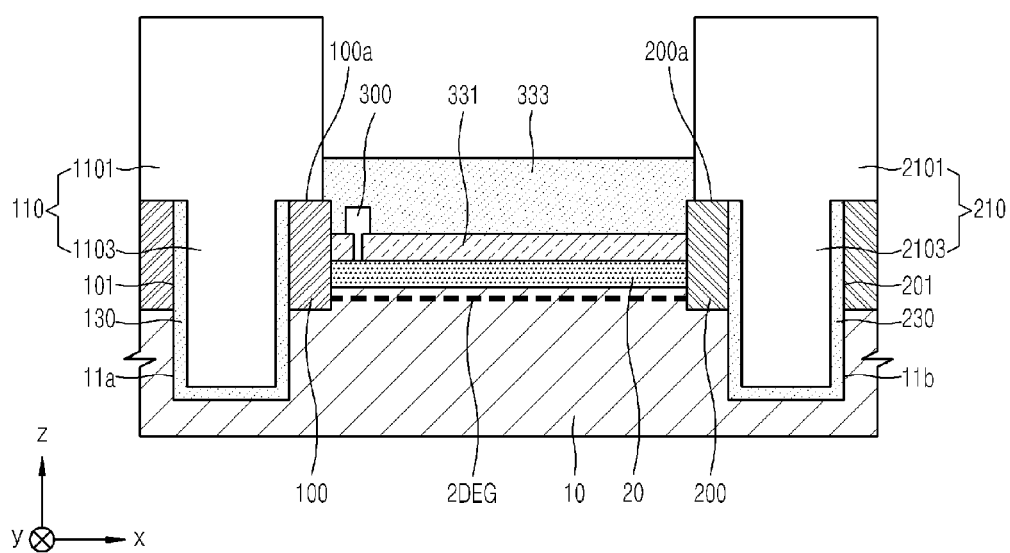
FIG. 2 is a cross-sectional view taken along a line II-II' of FIG. 1, according to example embodiments.

FIG. 1 is a plan view of a HEMT according to example embodiments. FIG. 2 is a cross-sectional view taken along a line II-II' of FIG. 1. Insulating layers 331 and 333 illustrated in FIG. 2 that cover a gate electrode 300 are not illustrated in FIG. 1.

Referring to FIGS. 1 and 2, the HEMT may include a channel layer 10, a channel supply layer 20 on the channel layer 10, a first electrode 100 and a second electrode 200 on the channel layer 10, the gate electrode 300 between the first electrode electrode 100 and the second electrode electrode 200, and a first pad 110 and a second pad 210 that electrically contact the first electrode 100 and the second electrode 200, respectively. Hereafter, for ease of the description, example embodiments where the first electrode 100 is a source electrode, the second electrode 200 is a drain electrode, the first pad 110 is a source pad, and the second pad 210 is a drain pad are described.

The channel layer 10 is a layer for forming a channel between the source electrode 100 and the drain electrode 200, and may be a semiconductor layer. For example, the channel layer 10 may include at least one of various materials including GaN, InGaN, and AlGaN. However, example embodiments are not limited thereto, and the channel layer 10 may be formed of another material, provided that a two-dimensional electron gas (2DEG) may be formed in the channel layer 10. The channel layer 10 may be an undoped layer. In some cases, however, the channel layer 10 may be doped with impurities.

The channel supply layer 20 may be disposed on the channel layer 10. The channel supply layer 20 may include a material (e.g., a semiconductor), of which at least one of a polarization characteristic, an energy bandgap, and a lattice constant is different from that of the channel layer 10. For example, the channel supply layer 20 may include a material (e.g., a semiconductor) having a polarizability and/or an energy bandgap that is greater than that of the channel layer 10. For example, the channel supply layer 20 may have a single- or multi-layered structure including at least one nitride that includes at least one of Al, Ga, In, and B. In particular, the channel supply layer 20 may have a single- or multi-layered structure including at least one of various materials including AlGaN, AlInN, InGaN, AlN, AlInGaN, and the like. The channel supply layer 20 may be undoped. In some cases, however, the channel supply layer 20 may be doped with impurities.

A 2DEG may be formed in a part of the channel layer 10. The 2DEG may be formed in a region of the channel layer 10 under an interface between the channel layer 10 and the channel supply layer 20. The 2DEG formed in the channel layer 10 may be used as a current path, e.g., a channel, between the source electrode 100 and the drain electrode 200. The HEMT may be a horizontal electric field applying type transistor in which an electric field is applied through the 2DEG that is horizontally formed in the channel layer 10.

The source electrode 100 and the drain electrode 200 may be arranged in various configurations in which the 2DEG may be used as a channel. For example, as shown in FIG. 2, the channel supply layer 20 and a portion of the channel layer 10 are etched to form a region on which the source electrode 100 is to be formed and a region on which the drain electrode 200 is to be formed, and then, the source and drain electrodes 100 and 200 may be formed on the respective regions. As another example, although not shown in FIG. 2, the source electrode 100 and the drain electrode 200 may be formed on the channel supply layer 20, or the channel supply layer 20 may be etched to a desired (and/or alternatively predetermined) depth and the source and drain electrodes 100 and 200 may be formed on the etched regions. The source electrode 100 and the drain electrode 200 may be in ohmic contact with the channel layer 10 or the channel supply layer 20.

The source electrode 100 and the drain electrode 200 may be spaced apart from each other, and the gate electrode 300 may be disposed between the source and drain electrodes 100 and 200. The gate electrode 300 may control a current flowing between the source electrode 100 and the drain electrode 200. The gate electrode 300 may have various structures so as to control a current flowing between the source and drain electrodes 100 and 200. For example, the gate electrode 300 may form a Schottky contact with the channel supply layer 20. In this case, the gate electrode 300 may be formed of a material capable of forming a Schottky contact with the channel supply layer 20 (e.g., a metal or a metallic compound). In some cases, however, the Schottky contact between the gate electrode 300 and the channel supply layer 20 may not be formed. Before forming the gate electrode 300, the insulating layer 331 may be formed on the channel supply layer 20. The insulating layer 331 may limit (and/or prevent) a change in properties of the channel supply layer 20 in a process of forming the gate electrode 300, for example, an etching process. The insulating layer 331 may include, for example, at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and combinations thereof. In addition to the above-listed materials, any insulating material that is used in a general transistor may be used as a material for forming the insulating layer 331.

The source pad 110 and the drain pad 210 electrically contact the source electrode 100 and the drain electrode 200, respectively.

At least one of the source pad 110 and the drain pad 210 may have a structure in which at least a portion thereof is inserted into (and/or extends into) the corresponding source electrode 100 and/or drain electrode 200 that is/are in electrical contact therewith.

To form a structure in which at least one portion of each of the source pad 110 and the drain pad 210 (hereinafter, referred to as "pad") is inserted into (and/or extends into) the respective source and drain electrodes 100 and 200 (hereinafter, referred to as "electrode") that are in electrical contact therewith, the pad 110 may include a contact portion 1101 that electrically contacts the electrode 100 and an insertion portion 1103 that is inserted into (and/or extends into) the electrode 100 from a top surface 100a of the electrode 100, and the pad 210 may include a contact portion 2101 that electrically contacts the electrode 200 and an insertion portion 2103 that is inserted into (and/or extends into) the electrode 200 from a top surface 200a of the electrode 200. The pads 110 and 210 may obtain desired (and/or alternatively predetermined) areas for stable voltage supply by reducing (and/or minimizing) areas of the contact portions 1101 and 2101 which are needed for electrical contact and increasing the thicknesses of the insertion portions 1103 and 2103 that are respectively inserted into (and/or extend into) the electrodes 100 and 200. That is, in example embodiments, the desired (and/or alternatively predetermined) areas of the pads 110 and 210 may be obtained by increasing the depths of the pads 110 and 210 by using the insertion portions 1103 and 2103, without increasing the widths of the pads 110 and 210. In this regard, the widths of the pads 110 and 210 mean the lengths of the pads 110 and 210 in a direction (x-axis direction) parallel to a longitudinal direction of a channel formed in the channel layer 10, and the thicknesses of the pads 110 and 210 mean the lengths of the pads 110 and 210 in a direction (z-axis direction) perpendicular to the longitudinal direction of the channel. The thicknesses of the pads 110 and 210 are the sum of the heights of the pads 110 and 210 and the depths of the pads 110 and 210. In this regard, the heights of the pads 110 and 210 mean the thicknesses of portions thereof that protrude to the outside from the top surfaces 100a and 200a of the electrodes 100 and 200, and the depths of the pads 110 and 210 mean the thicknesses of portions thereof that are inserted into (and/or extend into) the electrodes 100 and 200 from the top surfaces 100a and 200a of the electrodes 100 and 200.

Figure 3:
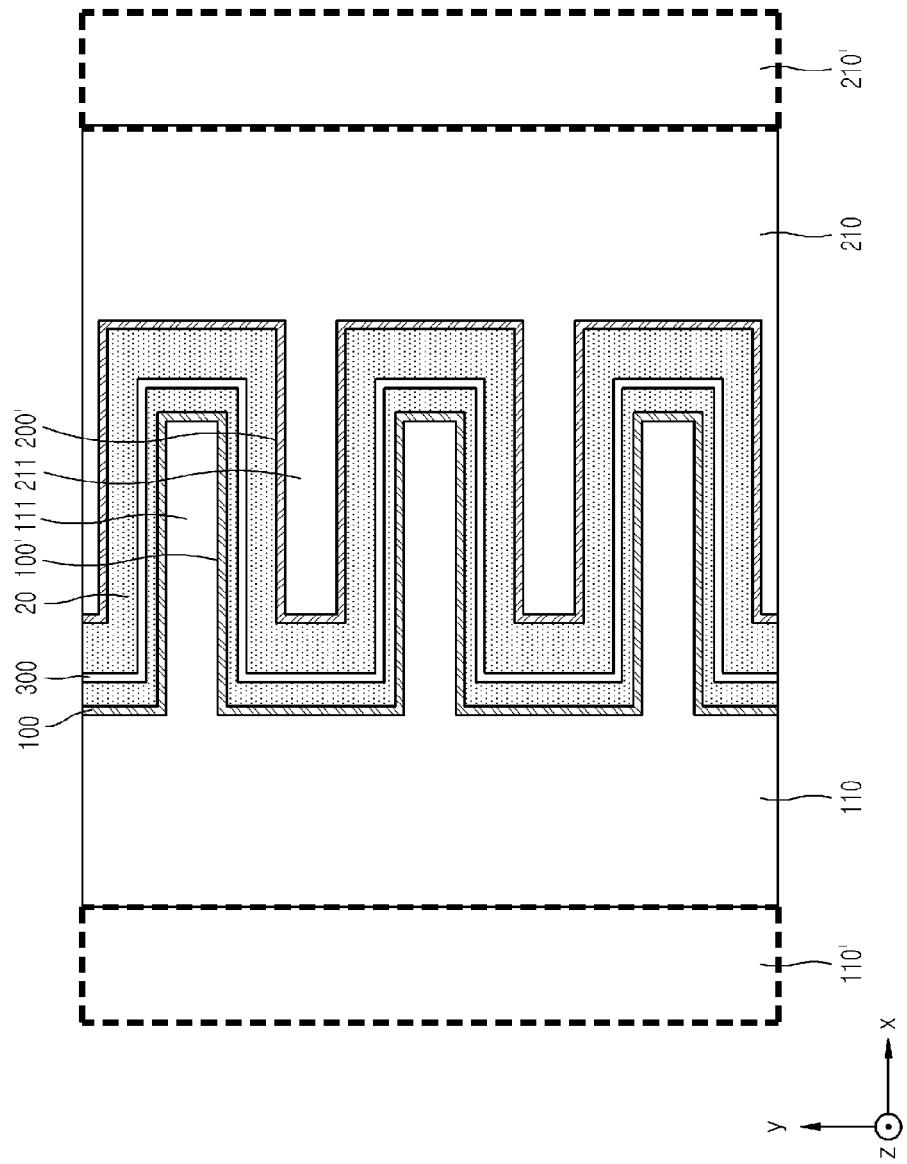
FIG. 3 is a plan view of a HEMT according to example embodiments.

In other words, the pads 110 and 210 may have desired (and/or alternatively predetermined) areas that are needed for stable voltage supply by including the insertion portions 1103 and 2103, without increasing the widths of the pads 110 and 210. Accordingly, by including the insertion portions 1103 and 2103, problems that may occur when increasing the widths of the pads 110 and 210, e.g., a reduction in the length of the channel of the channel layer 10 or an increase in the size of the HEMT, may be limited (and/or prevented). FIG. 3 is a plan view of a HEMT according to example embodiments. As shown in FIG. 3, the pads 110 and 210 may have decreased widths by including the insertion portions 1103 and 2103, and accordingly, the channel may have a relatively large length. In FIG. 3, portions 110' and 210' represented by dashed lines denote reduced regions of the pads 110 and 210 by the insertion portions 1103 and 2103.

In addition, to thickly form the pads 110 and 210, the pads 110 and 210 are formed deep, and thus, the heights of the pads 110 and 210 may not be increased. Accordingly, problems that occur due to the increase in heights of the pads 110 and 210, e.g., complicated manufacturing processes and a reduction in adhesive strengths between the pad 110 and the electrode 100 and between the pad 210 and the electrode 200, may be limited (and/or prevented).

Referring back to FIG. 2, the insertion portions 1103 and 2103 are disposed in pad accommodation portions (11a, 101) and (11b, 201), respectively. The pad accommodation portions (11a, 101) and (11b, 201) may have various structures that enable the insertion portions 1103 and 2103 to be respectively disposed therein.

Figure 4:
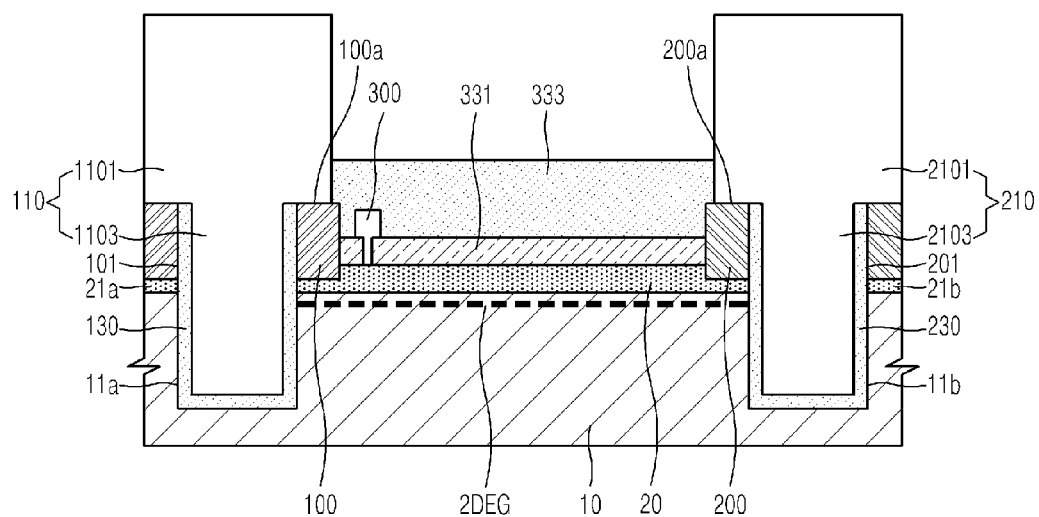
FIGS. 4 through 6 are cross-sectional views of HEMTs according to example embodiments.

In example embodiments, the pad accommodation portions (11a, 101) and (11b, 201) may be formed so as to respectively penetrate the electrodes 100 and 200 that electrically contact the pads 110 and 210, respectively. Accordingly, the pad accommodation portions (11a, 101) and (11b, 201) may be formed to extend to the electrodes 100 and 200 and layers disposed below the electrodes 100 and 200. For example, when the channel layer 10 is disposed below the electrodes 100 and 200, the pad accommodation portions (11a, 101) and (11b, 201) may be formed through the electrodes 100 and 200 and a portion of the channel layer 10. In example embodiments, as illustrated in FIG. 4, when the electrodes 100 and 200 are formed on the channel supply layer 20, the pad accommodation portions (11a, 101) and (11b, 201) may be formed through the electrodes 100 and 200, the channel supply layer 20, and a portion of the channel layer 10. As described above, by forming the pad accommodation portion (11a, 101) and a pad accommodation portion (11a, 21a, 101) through the electrode 100 and forming the pad accommodation portion (11b, 201) and a pad accommodation portion (11b, 21b, 201) through the electrode 200, a portion of each of the insertion portions 1103 and 2103 may be formed to extend to at least one of the channel layer 10 and the channel supply layer 20.

However, the disposition of the pad accommodation portions (11a, 101), (11b, 201), (11a, 21a, 101) and (11b, 21b, 201) is not limited to the above example. That is, the pad accommodation portions (11a, 101), (11b, 201), (11a, 21a, 101) and (11b, 21b, 201) may have various shapes according to the areas of the pads 110 and 210 which are embodied by including the insertion portions 1103 and 2103. As an example, the pad accommodation portions 101 and 201 may be recessed into the electrodes 100 and 200 instead of penetrating through the electrodes 100 and 200. In this case, bottom surfaces of the insertion portions 1103 and 2103 may be disposed in the electrodes 100 and 200, respectively.

The insertion portions 1103 and 2103 disposed in the pad accommodation portions (11a, 101) and (11b, 201), respectively, or (11a, 21a, 101) and (11b, 21b, 201), respectively, or 101 and 201, respectively, may be formed simultaneously or integrally with the contact portions 1101 and 2101, respectively. However, the shapes of the contact portions 1101 and 2101 and the insertion portions 1103 and 2103 are not limited to the above example. For example, the contact portions 1101 and 2101 and the insertion portions 1103 and 2103 may be formed as separate elements.

Figure 5:
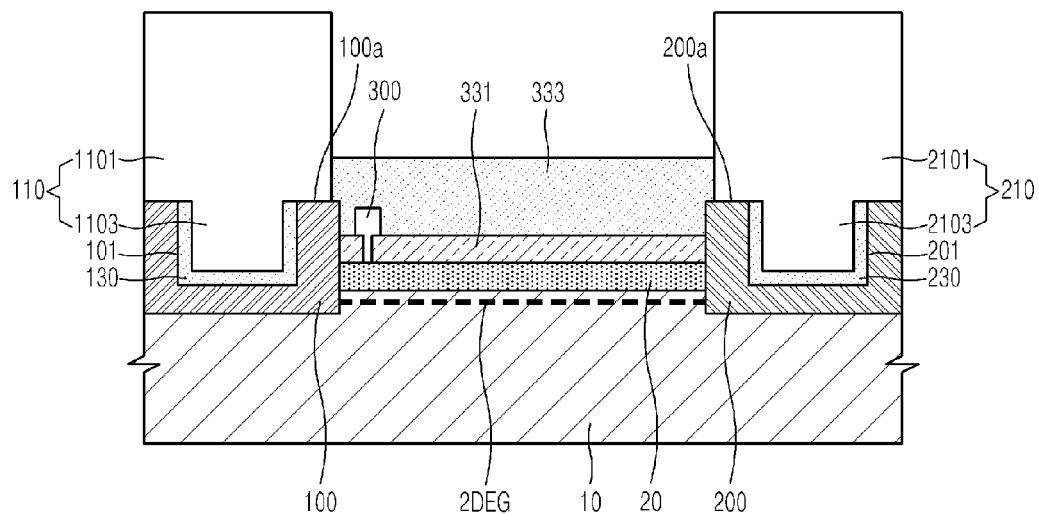

Insulating layers 130 and 230 may be formed on the remaining regions of the insertion portions 1103 and 2103, respectively, except for regions thereof contacting the contact portions 1101 and 2101. Electrical contact of the insertion portions 1103 and 2103 with the channel layer 10 and/or the channel supply layer 20 through the insulating layers 130 and 230 may be blocked. The insulating layers 130 and 230 may have various structures as long as they are capable of blocking the electrical contact of insertion portions 1103 and 2103 with the channel layer 10 and/or the channel supply layer 20. As an example, as illustrated in FIG. 2, when the electrodes 100 and 200 are formed on the channel layer 10 and the pad accommodation portions (11a, 101) and (11B, 201) are formed through the electrodes 100 and 200 and a portion of the channel layer 10, the insulating layer 130 may be disposed between the insertion portion 1103 and the electrode 100 and between the insertion portion 1103 and the channel layer 10, and the insulating layer 230 may be disposed between the insertion portion 2103 and the electrode 200 and between the insertion portion 2103 and the channel layer 10. In example embodiments, as illustrated in FIG. 4, when the electrodes 100 and 200 are formed on the channel supply layer 20 and the pad accommodation portions (11a, 21a, 101) and (11b, 21b, 201) are formed through the electrodes 100 and 200, the channel supply layer 20, and a portion of the channel layer 10, the insulating layer 130 may be disposed between the insertion portion 1103 and the electrode 100, between the insertion portion 1103 and the channel supply layer 20, and between the insertion portion 1103 and the channel layer 10, and the insulating layer 230 may be disposed between the insertion portion 2103 and the electrode 200, between the insertion portion 1103 and the channel supply layer 20, and between the insertion portion 2103 and the channel layer 10. In example embodiments, as illustrated in FIG. 5, when the pad accommodation portions 101 and 201 are formed in the electrodes 100 and 200, respectively, the insulating layers 130 and 230 may be disposed between the insertion portions 1103 and 2103 and the electrodes 100 and 200. The insulating layers 130 and 230 may include, for example, at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and combinations thereof. Also, any insulating material that is used in a general transistor may be used as a material for forming the insulating layers 130 and 230.

Figure 6:
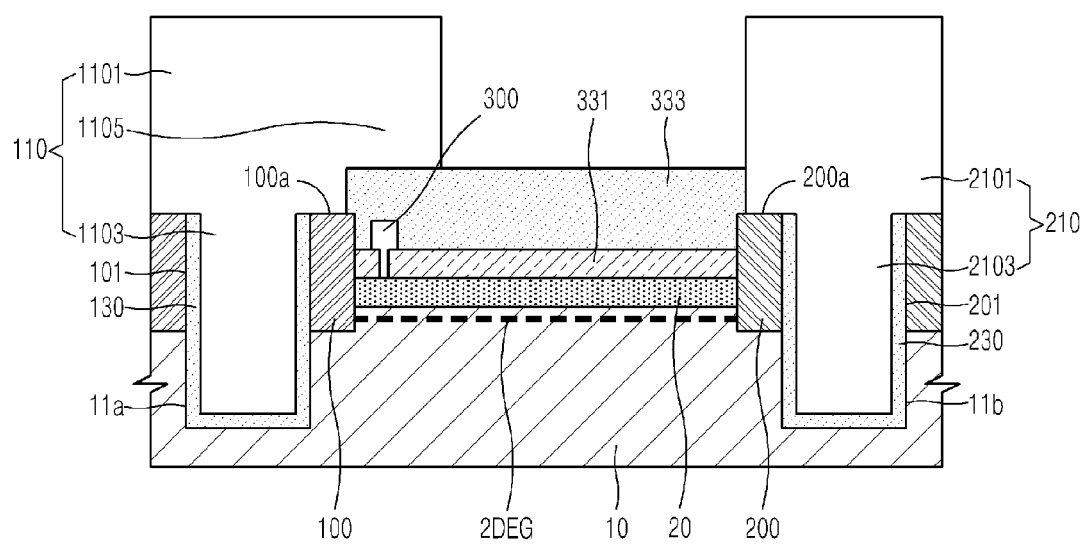

According to example embodiments, the source pad 110 may further include a field plate 1105 as illustrated in FIG. 6. Thus, an electric field concentrated on the gate electrode 300 may be dispersed through the field plate 1105.

The structure in which portions of the source pad 110 and the drain pad 210 are inserted respectively into (and/or extend into) the source electrode 100 and the drain electrode 200 has been described. However, the structure thereof is not limited to the above example. For example, a portion of the source pad 110 may be inserted into (and/or extend into) the source electrode 100 and the drain pad 210 may not be inserted into the drain electrode 200. Alternatively, the drain pad 210 may be inserted into (and/or extend into) the drain electrode 200 and the source pad 110 may not be inserted into (and/or extend into) the source electrode 100.

Figure 7:
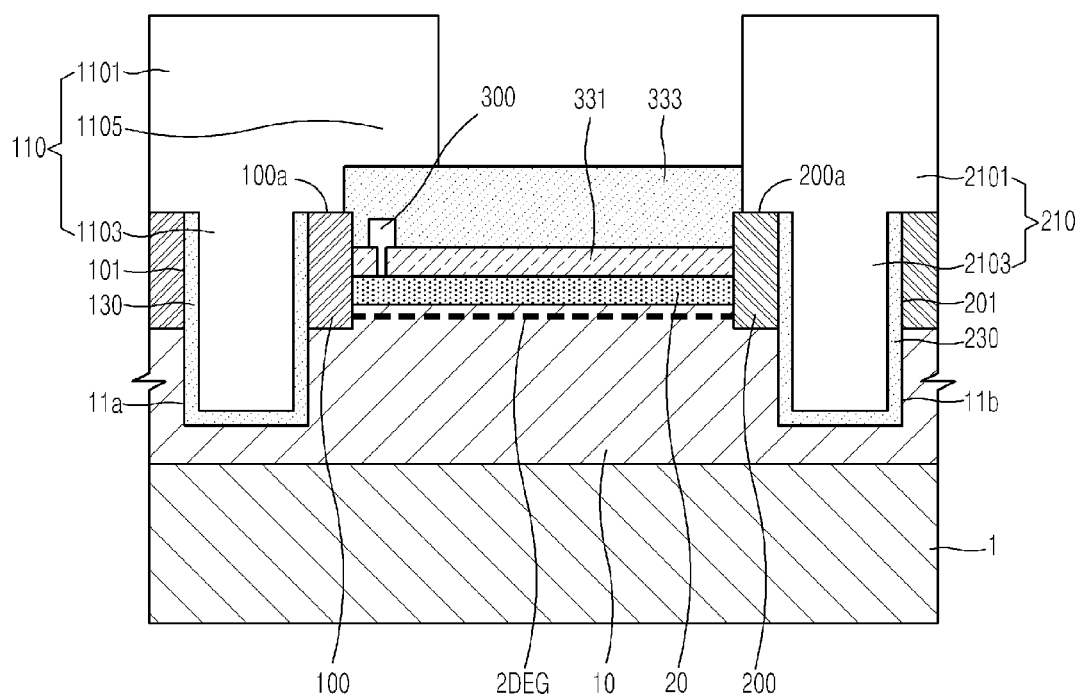
FIG. 7 is a cross-sectional view of the HEMT of FIG. 6 further including a substrate, according to example embodiments.

FIG. 7 is a cross-sectional view of the HEMT of FIG. 6 further including a substrate, according to example embodiments.

The HEMT may include a substrate 1, the channel layer 10 formed on the substrate 1, the channel supply layer 20 on the channel layer 10, the source and drain electrodes 100 and 200 on the channel layer 10, the gate electrode 300 between the source and drain electrodes 100 and 200, and the source pad 110 and the drain pad 210 that electrically contact the source electrode 100 and the drain electrode 200, respectively. In example embodiments, the same reference numerals as those described previously denote the same elements, and a detailed description thereof will not be repeated here.

The substrate 1 may be formed of, for example, sapphire, Si, SiC, or GaN.

At least a portion of at least one of the source pad 110 and the drain pad 210 may be inserted into the corresponding electrodes 100 and 200 that electrically contact the source and drain pads 110 and 210.

As an example of the structure in which at least portions of the pads 110 and 210 are inserted into the respective electrodes 100 and 200, the insertion portions 1103 and 2103 may be disposed through the respective electrodes 100 and 200 and a portion of the channel layer 10. The pad accommodation portions (11a, 101) and (11b, 201) may be formed through the respective electrodes 100 and 200 and a portion of the channel layer 10.

Figure 8:
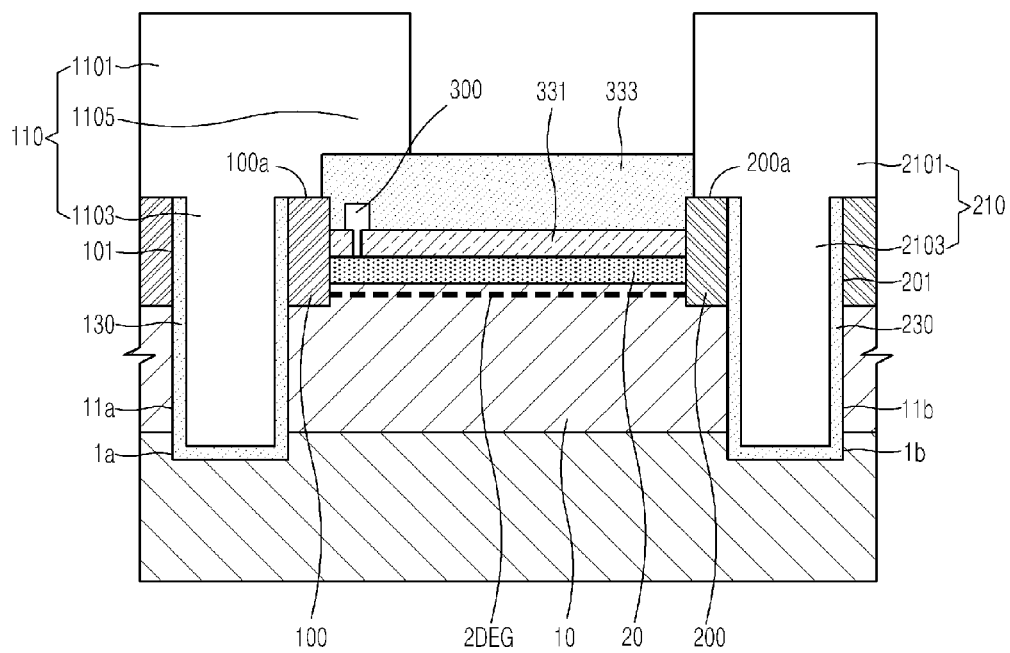
FIG. 8 is a cross-sectional view of a HEMT according to example embodiments.

FIG. 8 is a cross-sectional view of a HEMT according to example embodiments.

Referring to FIG. 8, the insertion portion 1103 may be disposed through the electrode 100, the channel layer 10, and a portion of the substrate 1, and the insertion portion 2103 may be disposed through the electrode 200, the channel layer 10, and a portion of the substrate. In this case, a pad accommodation portion (1a, 11a, 101) may be formed through the electrode 100, the channel layer 10, and a portion of the substrate 1, and a pad accommodation portion (1b, 11b, 201) may be formed through the electrode 200, the channel layer 10, and a portion of the substrate 1. In this regard, the insulating layer 130 may be disposed between the insertion portion 1103 and the electrode 100, between the insertion portion 1103 and the channel layer 10, and between the insertion portion 1103 and the substrate 1, and the insulating layer 230 may be disposed between the insertion portion 2103 and the electrode 200, between the insertion portion 2103 and the channel layer 10, and between the insertion portion 2103 and the substrate 1. The insulating layers 130 and 230 may include, for example, at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and combinations thereof. Also, any insulating material that is used in a general transistor may be used as a material for forming the insulating layers 130 and 230.

Although not illustrated in FIG. 8, a buffer layer may be disposed between the substrate 1 and the channel layer 10. The buffer layer may reduce differences between lattice constants and thermal expansion coefficients of the substrate 1 and the channel layer 10, thereby limiting (and/or preventing) the deterioration of crystallinity of the channel layer 10. The buffer layer may have a single- or multi-layered structure including at least one material selected from nitride materials including at least one of Al, Ga, In, and B. In particular, the buffer layer may have a single- or multi-layered structure including at least one selected from the group consisting of AlN, GaN, AlGaN, InGaN, AlInN, and AlGaInN.

In some cases, a desired (and/or alternatively predetermined) seed layer (not shown) may be further disposed between the substrate 1 and the buffer layer. The seed layer may be a base layer for growing the buffer layer. The substrate 1 and the buffer layer may be removed after manufacturing the HEMT. That is, the substrate 1 and the buffer layer may be selectively included in the HEMT.

The insertion portions 1103 and 2103 of the pads 110 and 210 may be disposed in a discontinuous form along a longitudinal direction of the pads 110 and 210, respectively. In this regard, the longitudinal direction of the pads 110 and 210 means a direction (y-axis direction) perpendicular to a longitudinal direction α-axis direction) of the channel.

As an example, a plurality of the insertion portions 1103 and 2103 may be spaced apart from one another along the longitudinal direction of the pads 110 and 210, respectively.

Figure 9:
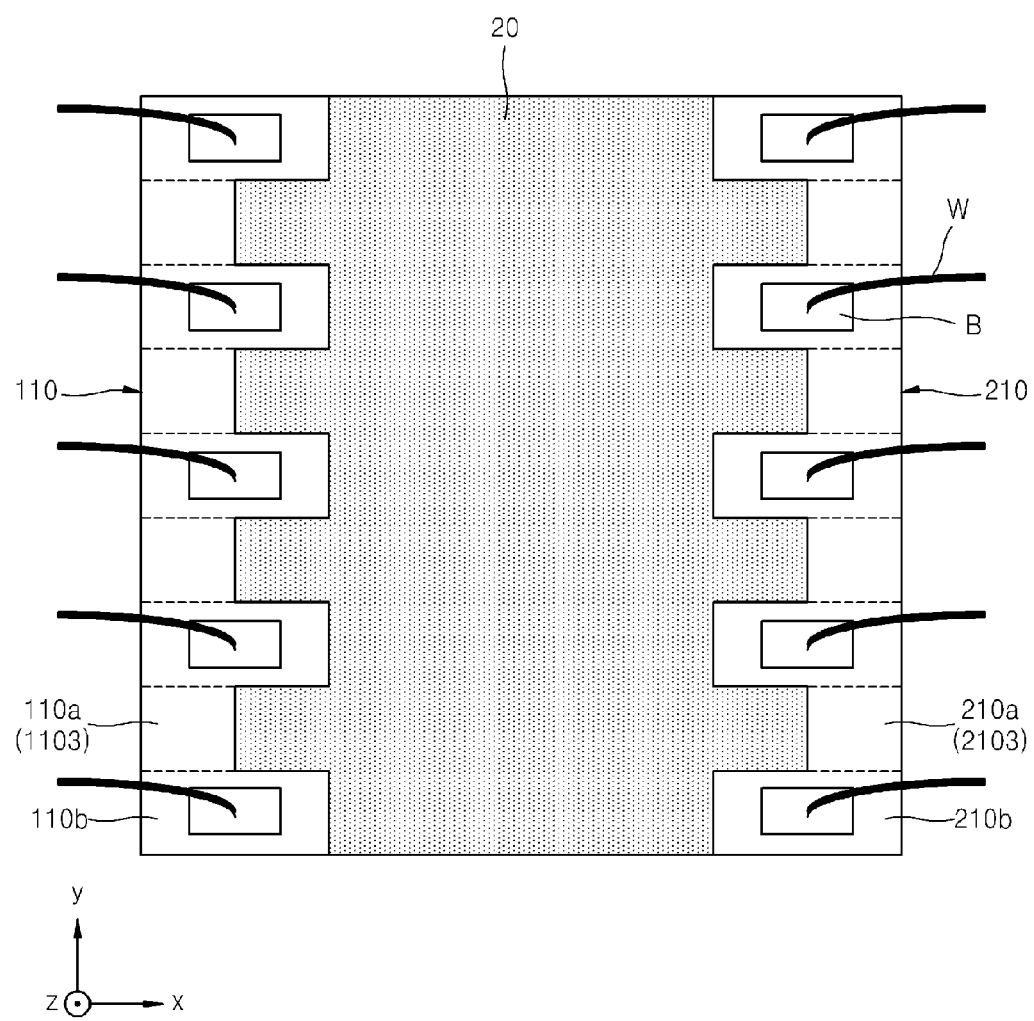
FIG. 9 is a plan view of a HEMT according to example embodiments, which adopts different source and drain pads from those of FIG. 1, according to example embodiments.

FIG. 9 is a plan view of the HEMT according to example embodiments, which adopts different source and drain pads from those of FIG. 1, according to example embodiments. In FIG. 9, for convenience of explanation, the source electrode 100, the drain electrode 200, and the gate electrode 300 are not illustrated. Referring to FIG. 9, the insertion portions 1103 and 2103 are spaced apart from one another along the longitudinal direction of the pads 110 and 210. In the source and drain pads 110 and 210, first regions 110a and 210a where the insertion portions 1103 and 2103 are respectively formed and second regions 110b and 210b where the insertion portions 1103 and 2103 are not formed may be arranged alternately along the longitudinal direction of the pads 110 and 210, respectively.

The thicknesses of the pads 110 and 210 are increased by the first regions 110a and 210a, respectively, in which the insertion portions 1103 and 2103 are formed, and thus, the widths of the pads 110 and 210 may be decreased. Accordingly, the widths of the first regions 110a and 210a may be smaller than the widths of the second regions 110b and 210b.

Each of the second regions 110b and 210b may include a bonding area B that is bonding-connected to a lead wire W.

Since the lead wire W is bonding-connected to each of the second regions 110b and 210b having a relatively larger width than that of the first regions 110a and 210a, respectively, the lead wires W may be stably connected to the pads 110 and 210. In this regard, the lead wires W transmit a bias voltage, which is received from the outside, to the source pad 110 and the drain pad 210.

In summary, the areas of the first regions 110a and 210a are decreased by the insertion portions 1103 and 2103, respectively, thereby obtaining a sufficient channel region, and the second regions 110b and 210b with a large area may be stably bonded with the lead wire W.

In FIG. 9, a source finger 100' and a drain finger 200' (see FIG. 1) are not illustrated, but the structure of the HEMT is not limited to the example. That is, in some cases, as illustrated in FIG. 1, a source pad 111 and a drain pad 211 may be inserted into the source finger 100' and the drain finger 200', respectively. In this regard, the source finger 100' may be connected to the first region 110a and the second region 110b of the source electrode 100, and the drain finger 200' may be connected to the first region 210a and the second region 210b of the drain electrode 200.

In the HEMT, the source electrode 100 may include a plurality of source fingers 100' (see FIG. 1), and the drain electrode 200 may include a plurality of drain fingers 200' (see FIG. 1). The source finger 100' is formed to protrude toward the drain electrode 200 from the source electrode 100, and the drain finger 200' is formed to protrude toward the source electrode 100 from the drain electrode 200. The contact portion 1111 and the insertion portion 1113 of the source pad 111 and the contact portion 2111 and the insertion portion 2113 of the drain pad 211 may be used as the source finger 100' and the drain finger 200', respectively.

Figure 10:
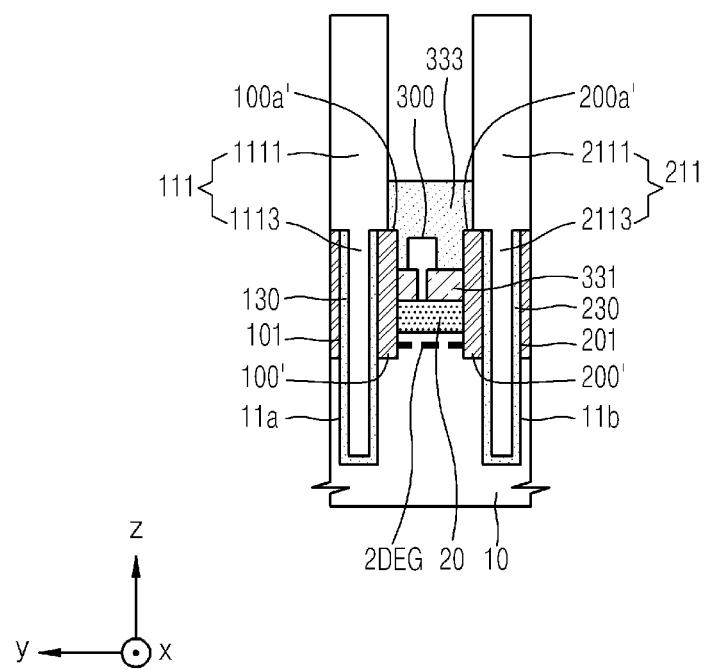
FIG. 10 is a cross-sectional view taken along a line X-X' of FIG. 1.

FIG. 10 is a cross-sectional view taken along line X-X' of FIG. 1, according to example embodiments. Referring to FIG. 10, at least portions of the source pad 111 and the drain pad 211 may be inserted into (and/or extend into) the source finger 100' and the drain finger 200' (hereinafter, referred to as "finger").

To form such a structure in which at least portions of the source pad 111 and the drain 211 (hereinafter, referred to as "finger pad") are inserted (and/or extend) respectively into the fingers 100' and 200' that electrically contact the finger pads 111 and 211, respectively, the finger pad 111 may include a contact portion 1111 that electrically contacts the finger 100' and an insertion portion 1113 that is inserted into (and/or extends into) the finger 100' from a top surface 100a' of the finger 100', and the finger pad 211 may include a contact portion 2111 that electrically contacts the finger 200' and an insertion portion 2113 that is inserted into the finger 200' from a top surface 200a' of the finger 200'. The finger pads 111 and 211 may have desired (and/or alternatively predetermined) areas for stable voltage supply by minimizing areas of the contact portions 1111 and 2111 which are needed for electrical contact with the fingers 100' and 200' and increasing the thicknesses (depths) of the insertion portions 1113 and 2113 that are respectively inserted into (and/or extend into) the fingers 100' and 200'. In other words, in example embodiments, the desired (and/or alternatively predetermined) areas of the finger pads 111 and 211 may be obtained by increasing the depths of the pads 110 and 210 by using the insertion portions 1113 and 2113, without increasing the widths of the finger pads 111 and 211. In this regard, the widths of the finger pads 111 and 211 mean the lengths of the finger pads 111 and 211 in a direction (y-axis direction) parallel to a longitudinal direction of a channel formed in the channel layer 10, and the thicknesses of the finger pads 111 and 211 mean the lengths of the finger pads 111 and 211 in a direction (z-axis direction) perpendicular to the longitudinal direction of the channel. The thicknesses of the finger pads 111 and 211 are the sum of the depths of the finger pads 111 and 211 and the heights of the finger pads 111 and 211. In this regard, the depths of the finger pads 111 and 211 mean the thicknesses of portions thereof that protrude to the outside from the top surfaces 100a' and 200a' of the fingers 100' and 200', and the heights of the finger pads 111 and 211 mean the thicknesses of portions thereof that are inserted into the fingers 100' and 200' from the top surfaces 1100a' and 200a' of the fingers 100' and 200'.

In summary, the finger pads 111 and 211 may have desired (and/or alternatively predetermined) areas that are needed for stable voltage supply by including the insertion portions 1113 and 2113, without increasing the widths of the finger pads 111 and 211. Accordingly, by including the insertion portions 1113 and 2113, problems that may occur when increasing the widths of the finger pads 111 and 211, e.g., a reduction in the length of the channel of the channel layer 10 or an increase in the size of the HEMT, may be limited (and/or prevented). In addition, to thickly form the finger pads 111 and 211, the finger pads 111 and 211 are formed deep, and thus, the heights of the finger pads 111 and 211 may not be increased. Accordingly, problems that occur due to the increase in heights of the finger pads 111 and 211, e.g., complicated manufacturing processes and a reduction in adhesive strengths between the finger pad 111 and the finger 100' and between the finger pad 211 and the finger 200', may be limited (and/or prevented).

The insertion portions 1113 and 2113 are disposed in pad accommodation portions (11a, 101) and (11b, 201), respectively. The pad accommodation portions (11a, 101) and (11b, 201) may have various structures that enable the insertion portions 1103 and 2103 to be respectively disposed therein.

In example embodiments, the pad accommodation portions (11a, 101) and (11b, 201) may be formed so as to respectively penetrate the fingers 100' and 200' that electrically contact the finger pads 111 and 211, respectively. Accordingly, the pad accommodation portions (11a, 101) and (11b, 201) may be formed to extend to the fingers 100' and 200' and layers disposed therebelow. For example, when the channel layer 10 is disposed below the fingers 100' and 200', the pad accommodation portions (11a, 101) and (11b, 201) may be formed through the fingers 100' and 200' and a portion of the channel layer 10. In example embodiments, although not illustrated in FIG. 10, when the fingers 100' and 200' are formed on the channel supply layer 20, the pad accommodation portions (11a, 101) and (11b, 201) may be formed through the fingers 100' and 200', the channel supply layer 20, and a portion of the channel layer 10. As described above, by forming the pad accommodation portions (11a, 101) and (11b, 201) through the fingers 100' and 200', a portion of each of the insertion portions 1113 and 2113 may be formed to extend to at least one of the channel layer 10 and the channel supply layer 20.

However, the disposition of the pad accommodation portions (11a, 101) and (11b, 201) is not limited to the above example. That is, the pad accommodation portions (11a, 101) and (11b, 201) may have various shapes according to the areas of the finger pads 111 and 211 which are embodied by including the insertion portions 1113 and 2113. As an example, the pad accommodation portions (11a, 101) and (11b, 201) may be recessed into the fingers 100' and 200' instead of penetrating through the fingers 100' and 200'. In this case, bottom surfaces of the insertion portions 1113 and 2113 may be disposed in the fingers 100' and 200', respectively.

The insertion portions 1113 and 2113 disposed in the pad accommodation portions (11a, 101) and (11b, 201), respectively may be formed simultaneously or integrally with the contact portions 1111 and 2111, respectively. However, the shapes of the contact portions 1111 and 2111 and the insertion portions 1113 and 2113 are not limited to the above example. For example, the contact portions 1111 and 2111 and the insertion portions 1113 and 2113 may be formed as separate elements.

Insulating layers 130 and 230 may be formed on the remaining regions of the insertion portions 1113 and 2113, respectively, except for regions thereof being connected with the contact portions 1111 and 2111. Electrical contact of the insertion portions 1113 and 2113 with the channel layer 10 and/or the channel supply layer 20 through the insulting layers 130 and 230 may be blocked. The insulating layers 130 and 230 may have various structures as long as they are capable of blocking the electrical contact of insertion portions 1103 and 2113 with the channel layer 10 and/or the channel supply layer 20. In one embodiment, when the fingers 100' and 200' are formed on the channel layer 10 and the pad accommodation portions (11a, 101) and (11B, 201) are formed through the fingers 100' and 200' and a portion of the channel layer 10, the insulating layer 130 may be disposed between the insertion portion 1113 and the finger 100' and between the insertion portion 1113 and channel layer 10, and the insulating layer 230 may be disposed between the insertion portion 2113 and the finger 200' and between the insertion portion 2113 and channel layer 10. In example embodiments, when the fingers 100' and 200' are formed on the channel supply layer 20 and pad accommodation portions (not shown) are formed through the fingers 100' and 200', the channel supply layer 20, and a portion of the channel layer 10, the insulating layer 130 may be disposed between the insertion portion 1113 and the finger 100', between the insertion portion 1113 and the channel supply layer 20, and between the insertion portion 1113 and the channel layer 10, and the insulating layer 230 may be disposed between the insertion portion 2113 and the finger 200', between the insertion portion 2113 and the channel supply layer 20, and between the insertion portion 2113 and the channel layer 10. In example embodiments, when pad accommodation portions (not shown) are formed in the fingers 100' and 200', respectively, the insulating layers 130 and 230 may be disposed between the insertion portions 1103 and 2103 and the fingers 100' and 200'. The insulating layers 130 and 230 may include, for example, at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and combinations thereof. Also, any insulating material that is used in a general transistor may be used as a material for forming the insulating layers 130 and 230.

According to example embodiments, the source pad 111 may further include a source field plate (not shown). Thus, an electric field concentrated on the gate electrode 300 may be dispersed through the source field plate.

The structure in which portions of the source pad 111 and the drain pad 211 are inserted respectively into the source finger 100' and the drain finger 200' has been described. However, the structure thereof is not limited to the above example. For example, a portion of the source pad 111 may be inserted into the source finger 100', and the drain finger 200' may not be inserted into the drain finger 200'. Alternatively, the source pad 111 may not be inserted into the source finger 100' and the drain pad 211 may be inserted into the drain finger 200'.

FIGS. 11A through 11G are cross-sectional views sequentially illustrating a method of manufacturing the HEMT of FIG. 6, according to example embodiments.

Figure 11A:
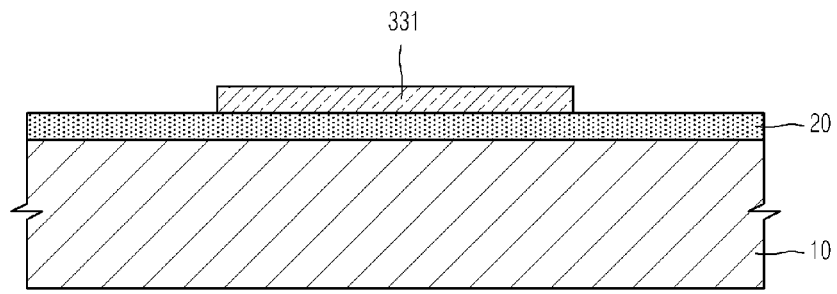
FIGS. 11A through 11G are cross-sectional views sequentially illustrating a method of manufacturing the HEMT of FIG. 6, according to example embodiments.

Referring to FIG. 11A, the channel supply layer 20 may be formed on the channel layer 10. The channel supply layer 20 may be formed of a different semiconductor from that of the channel layer 10. To form the channel supply layer 20 on the channel layer 10, an epitaxial growth method may be used. The channel supply layer 20 may be formed of a material (semiconductor) having a polarization characteristic, an energy bandgap, and a lattice constant, at least one of which is different from that of the channel layer 10. For example, the channel supply layer 20 may be formed of a material (semiconductor) having greater polarizability and/or energy bandgap than those of the channel layer 10. For example, the channel layer 20 may have a single- or multi-layered structure including one or more selected from the nitride materials including at least one of Al, Ga, In, and B. In particular, the channel supply layer 20 may be formed to have a single- or multi-layered structure including at least one of various materials including AlGaN, AlInN, InGaN, AlN, or AlInGaN. The channel supply layer 20 may be an undoped layer. In some cases, however, the channel supply layer 20 may be doped with desired (and/or alternatively predetermined) impurities. An insulating layer may be formed on the channel supply layer 20. The insulating layer may limit (and/or prevent) the properties of the channel supply layer 20 from being changed in the subsequent processes, e.g., a process of forming a gate.

Figure 11B:
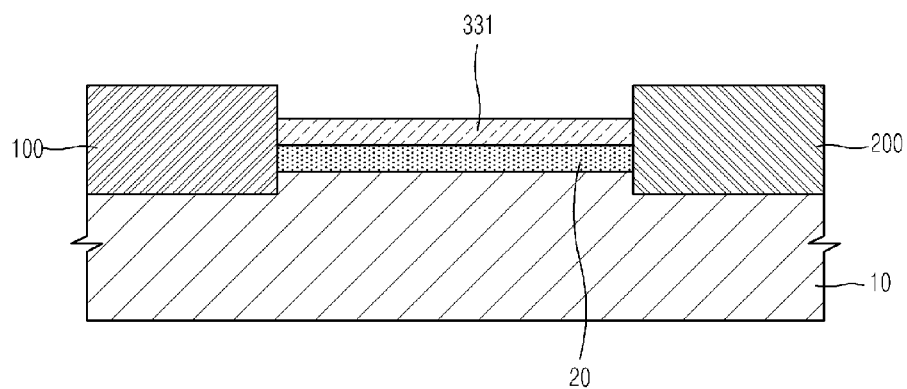

Referring to FIG. 11B, the source electrode 100 and the drain electrode 200 may be formed on the channel layer 10 or the channel supply layer 20. The source electrode 100 and the drain electrode 200 may be formed such that the channel supply layer 20 and the channel layer 10 are etched to form a region on which the source electrode 100 is to be formed and a region on which the drain electrode 200 is to be formed, and then, the source and drain electrodes 100 and 200 are formed on the respective regions. As another example, although not shown in FIG. 11B, the source electrode 100 and the drain electrode 200 may be formed on the channel supply layer 20, or the channel supply layer 20 may be etched to a desired (and/or alternatively predetermined) depth and the source and drain electrodes 100 and 200 may be formed on the etched regions.

Figure 11C:
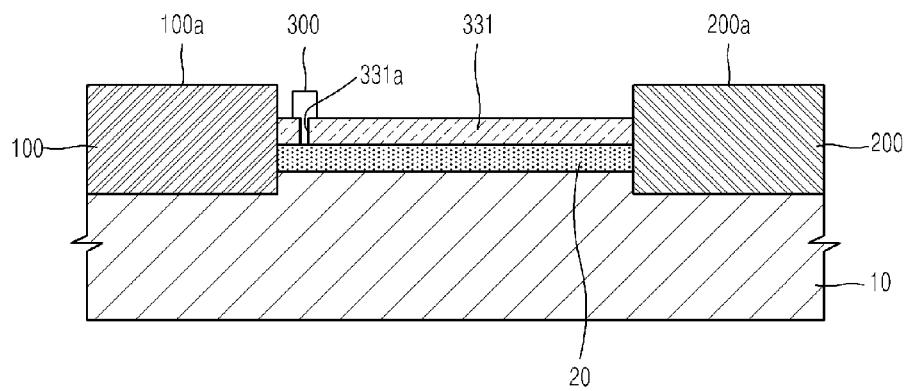

Referring to FIG. 11C, the gate electrode 300 may be formed between the source electrode 100 and the drain electrode 200. The gate electrode 300 may form a Schottky contact with the channel supply layer 20. In this case, the gate electrode 300 may be formed of a material capable of forming a Schottky contact with the channel supply layer 20 (e.g., a metal or a metallic compound). In some cases, however, the Schottky contact between the gate electrode 300 and the channel supply layer 20 may not be formed.

Figure 11D:
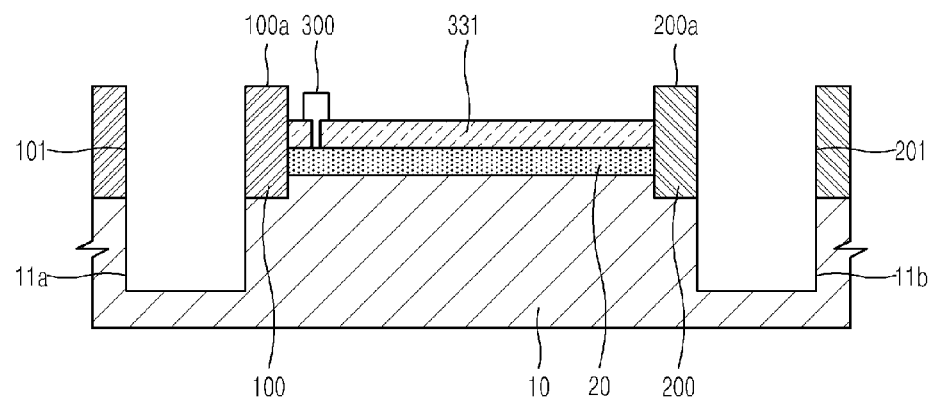

Referring to FIG. 11D, the pad accommodation portions (11a, 101) and (11b, 201) may be formed respectively from the top surfaces 100a and 200a of the source and drain electrodes 100 and 200. The pad accommodation portions (11a, 101) and (11b, 201) may have various structures that enable the insertion portions 1113 and 2113 to be respectively disposed therein.

As an example, the pad accommodation portions (11a, 101) and (11b, 201) may be formed so as to respectively penetrate the source and drain electrodes 100 and 200. That is, the pad accommodation portions (11a, 101) and (11b, 201) may be formed to extend to the source and drain electrodes 100 and 200 and layers disposed below the source and drain electrodes 100 and 200. For example, when the channel layer 10 is disposed below the source and drain electrodes 100 and 200, the pad accommodation portions (11a, 101) and (11b, 201) may be formed through the electrodes 100 and 200 and a portion of the channel layer 10. In example embodiments, as illustrated in FIG. 4, when the electrodes 100 and 200 are formed on the channel supply layer 20, the pad accommodation portions (11a, 21a, 101)(11b, 21b, 201) may be formed through the electrodes 100 and 200, the channel supply layer 20, and a portion of the channel layer 10. As described above, by forming the pad accommodation portions (11a, 101), (11b, 201), (11a, 21a, 101), and (11b, 21b, 201) through the electrodes 100 and 200, respectively, a portion of each of the insertion portions 1103 and 2103 may be formed to extend to at least one of the channel layer 10 and the channel supply layer 20. As another example, as illustrated in FIG. 5, the pad accommodation portions 101 and 201 may be recessed into the electrodes 100 and 200, instead of penetrating through the electrodes 100 and 200.

Figure 11E:
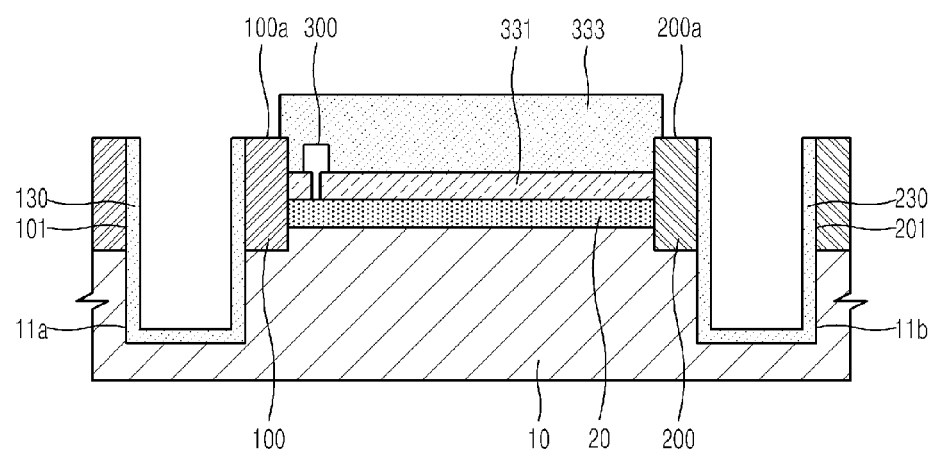

Referring to FIG. 11E, the insulating layers 130 and 230 may be formed in the pad accommodation portions (11a, 101) and (11b, 201), respectively. By forming the insulating layers 130 and 230 in the pad accommodation portions (11a, 101) and (11b, 201), respectively, electrical contact of the insertion portions 1103 and 2103 with the channel layer 10 and/or the channel supply layer 20 may be blocked. The insulating layers 130 and 230 may have various structures that block the electrical contact of the insertion portions 1103 and 2103 with the channel layer 10 and/or the channel supply layer 20. For example, as illustrated in FIG. 11E, when the pad accommodation portions (11a, 101) and (11b, 201) are formed through the electrodes 100 and 200 and a portion of the channel layer 10, the insulating layers 130 and 230 may be formed through the electrodes 100 and 200 and the portion of the channel layer 10 along inner surfaces of the pad accommodation portions (11a, 101) and (11b, 201), respectively. As another example, as illustrated in FIG. 4, when the pad accommodation portions (11a, 21a, 101) and (11b, 21b, 201) are formed through the electrodes 100 and 200, the channel supply layer 20, and a portion of the channel layer 10, the insulating layers 130 and 230 may be formed through the portion of the channel layer 10, the channel supply layer 20, and the electrodes 100 and 200 along the inner surfaces of the pad accommodation portions (11a, 21a, 101) and (11b, 21b, 201), respectively. As another example, as illustrated in FIG. 5, when the pad accommodation portions 101 and 201 are formed in the electrodes 100 and 200, respectively, the insulating layers 130 and 230 may be formed respectively in the electrodes 100 and 200 along the pad accommodation portions 101 and 201, respectively. Also, the insulating layer 333 may be formed on a surface of the gate electrode 300. By forming the insulating layer 333, electrical contact of the gate electrode 300 with other electrodes, e.g., the source and drain electrodes 100 and 200 may be blocked. The insulating layers 130, 230 and 333 may each include at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and combinations thereof. Also, any insulating material that is used in a general transistor may be used as a material for forming the insulating layers 130, 230 and 333.

Figure 11F:
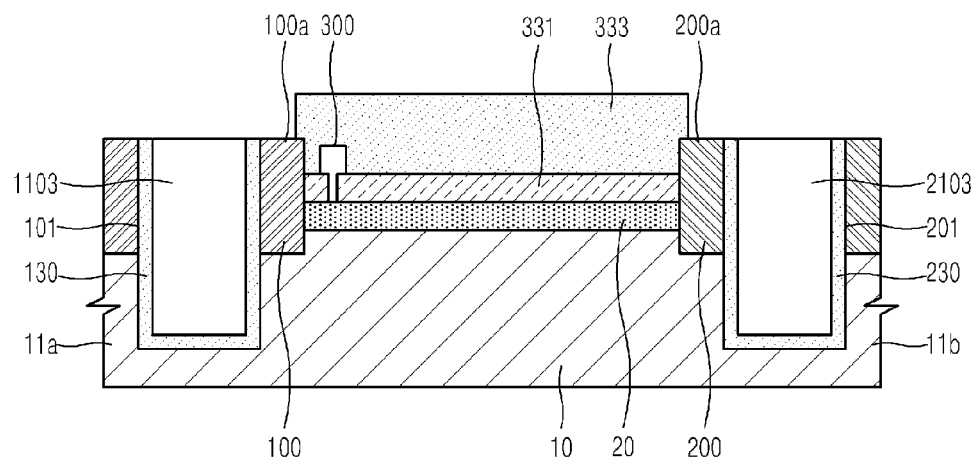

Referring to FIG. 11F, the insertion portions 1103 and 2103 may be formed inside the insulating layers 130 and 230 formed in the pad accommodation portions (11a, 101) and (11b, 201), respectively. By forming the insertion portions 1103 and 2103 in the insulating layers 130 and 230, electrical contact of the insertion portions 1103 and 2103 with the channel layer 10 and/or the channel supply layer 20 may be blocked by the insulating layers 130 and 230, respectively.

Figure 11G:
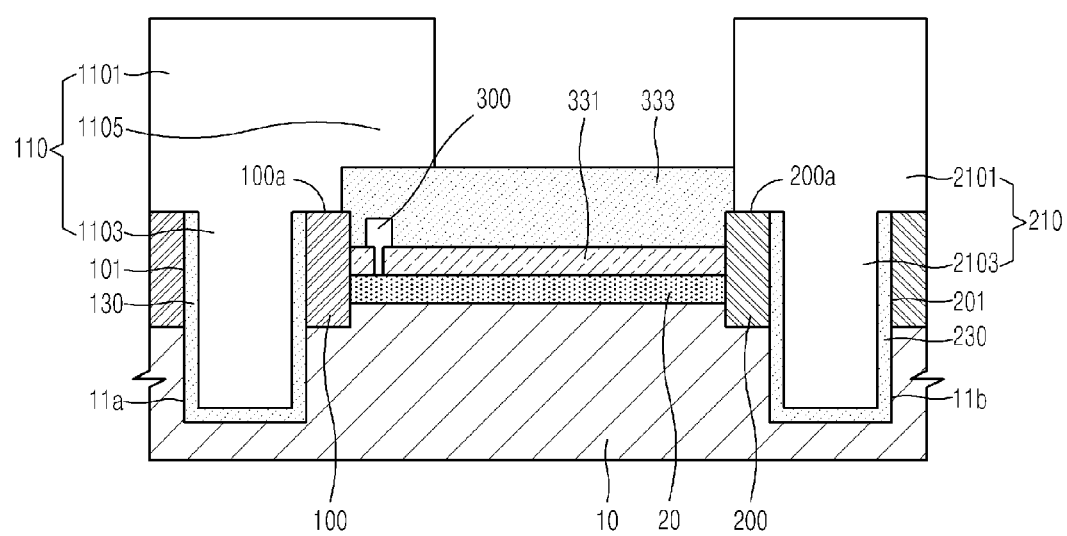

Referring to FIG. 11G, the contact portions 1101 and 2101 that electrically contact the source and drain electrodes 100 and 200, respectively may be formed on the insertion portions 1103 and 2103, respectively. The contact portions 1101 and 2101 may be formed simultaneously or integrally with the insertion portions 1103 and 2103, respectively. The source pad 110 may further include the field plate 1105 formed to extend toward the drain electrode 200.

The manufacturing method of the HEMT that has been described with reference to FIGS. 11A through 11G may be used to manufacture an HEMT having a structure in which at least portions of the source pad 110 and the drain pad 210 are inserted into the source finger 100' and the drain finger 200', respectively.

The HEMT described above may be used as, for example, a power device. However, the application field of the HEMT is not limited to the above example, and the HEMT may be used in various applications.

It should be understood that the exemplary embodiments described herein should be considered in a descriptive sense only and not for purposes of limitation. For example, it will be understood by those of ordinary skill in the art to which example embodiments pertain that the structures of the HEMT in the drawings may be variously changed. Specifically, other materials in addition to a GaN-based material may be used as materials for forming the channel layer 10 and the channel supply layer 20. Also, the disposition of the channel layer 10 and the channel supply layer 20 may be opposite to that described above. In addition, the manufacturing method of FIGS. 11A through 11G may be variously modified. Moreover, it will be understood by those of ordinary skill in the art that the HEMT may also be used in other semiconductor devices.

While some example embodiments have been particularly shown and described, it will be understood by one of ordinary skill in the art that variations in form and detail may be made therein without departing from the spirit and scope of the claims.

What is claimed is:

1. A high electron mobility transistor comprising:
a channel layer;
a channel supply layer on the channel layer;
a source electrode and a drain electrode that contact at least one of the channel layer and the channel supply layer;
a gate electrode between the source electrode and the drain electrode; and
a source pad and a drain pad that electrically contact a top surface of the source electrode and the drain electrode, respectively,
wherein at least a portion of at least one of the source pad and the drain pad extends into a corresponding one of the source electrode and the drain electrode that the at least one of the source pad and the drain pad is in electrical contact therewith.

2. The high electron mobility transistor of claim 1, wherein the source pad includes a contact portion that electrically contacts the source electrode, and
the source pad includes an insertion portion that extends into the source electrode.

3. The high electron mobility transistor of claim 2, wherein the insertion portion of the source pad penetrates the source electrode.

4. The high electron mobility transistor of claim 3, further comprising:
a substrate, wherein the channel layer is on the substrate.

5. The high electron mobility transistor of claim 4, wherein the insertion portion of the source pad extends to at least one of the channel supply layer, the channel layer, and the substrate.

6. The high electron mobility transistor of claim 2, further comprising:
an insulating layer between the insertion portion of the source pad and at least one of the channel layer and the source electrode.

7. The high electron mobility transistor of claim 2, wherein the source pad includes a plurality of the insertion portions, and
the plurality of insertion portions of the source pad are spaced apart from each other along a longitudinal direction of the source pad.

8. The high electron mobility transistor of claim 7, wherein the source pad includes a first region having the plurality of insertion portions and a second region that does not have the plurality of insertion portions, and
the first region and the second region are alternately arranged along the longitudinal direction of the source pad.

9. The high electron mobility transistor of claim 8, wherein an area of the first region of the source pad is smaller than an area of the second region of the source pad.

10. The high electron mobility transistor of claim 9, wherein
the second region of the source pad includes a bonding area that is bonding-connected to a lead wire.

11. The high electron mobility transistor of claim 1, wherein
the drain pad includes a contact portion that electrically contacts the drain electrode, and
the drain pad includes an insertion portion that extends into the drain electrode.

12. The high electron mobility transistor of claim 11, wherein the insertion portion of the drain pad penetrates the drain electrode.

13. The high electron mobility transistor of claim 12, further comprising:
a substrate, wherein the channel layer is on the substrate.

14. The high electron mobility transistor of claim 13, wherein the insertion portion of the drain pad extends to at least one of the channel supply layer, the channel layer, and the substrate.

15. The high electron mobility transistor of claim 11, further comprising:
an insulating layer between the insertion portion of the drain pad and at least one of the channel layer and the drain electrode.

16. The high electron mobility transistor of claim 11, wherein
the drain pad includes a plurality of the insertion portions, and
the plurality of insertion portions of the drain pad are spaced apart from each other along a longitudinal direction of the drain pad.

17. The high electron mobility transistor of claim 16, wherein
the drain pad includes a first region having the plurality of insertion portions and a second region that does not have the plurality of insertion portions, and
the first region and the second region are alternately arranged along the longitudinal direction of the drain pad.

18. The high electron mobility transistor of claim 17, wherein an area of the first region of the drain pad is smaller than an area of the second region of the drain pad.

19. The high electron mobility transistor of claim 18, wherein the second region of the drain pad includes a bonding area that is bonding-connected to a lead wire.

20. The high electron mobility transistor of claim 1, wherein
the source electrode includes a plurality of source fingers that extend toward the drain electrode,
the drain electrode includes a plurality of drain fingers that extend between the plurality of source fingers, and
the portion of the at least one of the source pad and the drain pad extends into a corresponding one of the plurality of source fingers and the plurality of drain fingers included in the source electrode and the drain electrode, respectively, that the at least one of the source pad and the drain pad is in electrical contact therewith.

21. The high electron mobility transistor of claim 20, wherein
the source pad includes a contact portion that electrically contacts at least one of the plurality of source fingers, and
an insertion portion that extends into at least one of the plurality of source fingers.

22. The high electron mobility transistor of claim 20, wherein
the drain pad includes a contact portion that electrically contacts at least one of the plurality of drain fingers, and an insertion portion that extends into at least one the plurality of drain fingers.

23. A method of manufacturing a high electron mobility transistor, the method comprising:
forming a channel supply layer on a channel layer;
forming a source electrode and a drain electrode that contact at least one of the channel layer and the channel supply layer;
forming a gate electrode between the source electrode and the drain electrode;
forming a source pad and a drain pad that electrically contact a top surface of the source electrode and the drain electrode, respectively, wherein at least a portion of at least one of the source pad and the drain pad extends into a corresponding one of the source electrode and the drain electrode that the at least one of the source pad and the drain pad is in electrical contact therewith.

24. The method of claim 23, further comprising:
forming pad accommodation portions that are recessed from top surfaces of the source electrode and the drain electrode; and
forming an insulating layer in each pad accommodation portion before the forming of the source pad and the drain pad.

25. A high electron mobility transistor comprising:
a channel layer;
a channel supply layer on the channel layer;
a source electrode and a drain electrode that contact at least one of the channel layer and the channel supply layer,
the source electrode including a plurality of source fingers that extend toward the drain electrode, and
the drain electrode including a plurality of drain fingers that extend between the plurality of source fingers;
a gate electrode between the source electrode and the drain electrode;
a source pad that electrically contacts a top surface of at least one of the plurality of source fingers; and
a drain pad that electrically contacts a top surface of at least one of the plurality of drain fingers,
wherein at least a portion of at least one of the source pad and the drain pad extends into a corresponding one of the plurality of source fingers and the plurality of drain fingers that the at least one of the source pad and the drain pad is in electrical contact therewith.

26. The high electron mobility transistor of claim 25, wherein the source pad includes a contact portion that electrically contacts at least one of the plurality of source fingers and an insertion portion that extends into at least one of the plurality of source fingers.

27. The high electron mobility transistor of claim 25, wherein the drain pad includes a contact portion that electrically contacts at least one of the plurality of drain fingers and an insertion portion that extends into at least one of the plurality of drain fingers.

28. A high electron mobility transistor, comprising:
a channel layer;
a channel supply layer on the channel layer;
a first electrode, a gate electrode, and a second electrode that are spaced apart and independently on at least one of the channel layer and the channel supply layer; and
at least one of,
a first pad having a contact portion that is electrically connected to a top surface of the first electrode and an insertion portion that extends into the first electrode, and
a second pad having a contact portion that is electrically connected a top surface of to the second electrode and an insertion portion that extends into the second electrode.

29. A high electron mobility transistor, comprising:
a channel layer;
a channel supply layer on the channel layer;
a first electrode, a gate electrode, and a second electrode that are spaced apart and independently on at least one of the channel layer and the channel supply layer;
at least one of,
a first pad having a contact portion that is electrically connected to the first electrode and an insertion portion that extends into the first electrode, and
a second pad having a contact portion that is electrically connected to the second electrode and an insertion portion that extends into the second electrode; and
an insulation layer between at least one of,
the insertion portion of the first pad and the first electrode, and
the insertion portion of the second pad and the second electrode.

30. The high electron mobility transistor of claim 29, wherein
the contact portion of at least one of the first pad and the second pad is on an upper surface of a corresponding one of the first electrode and the second electrode, and
the insertion portion of at least one of the first pad and the second pad extends from the contact portion of the at least one of the first pad and the second pad to at least one of the channel supply layer and the channel layer.

31. The high electron mobility transistor of claim 28, wherein
both the first pad and the second pad are included in the high electron mobility transistor,
the first electrode includes a plurality of first fingers that are spaced apart and extend toward the second electrode, the second electrode includes a plurality of second fingers that extend between the plurality of first fingers of the first electrode, the contact portion of the first pad is electrically connected to at least one of the plurality of first fingers, the contact portion of the second pad is electrically connected to at least one of the plurality of second fingers, the insertion portion of the first pad extends into at least one of the plurality of first fingers, and the insertion portion of the second pad extends into at least one of the plurality of second fingers.

32. The high electron mobility transistor of claim 28, wherein at least one of the first pad and the second pad includes a plurality of the insertion portions that are spaced apart along a longitudinal direction of the one of the first pad and the second pad.

* * * * *